(12) United States Patent
Suzuki et al.

(10) Patent No.: US 11,164,728 B2
(45) Date of Patent: Nov. 2, 2021

(54) PLASMA TREATMENT APPARATUS AND DRIVING METHOD THEREOF

(71) Applicant: Plasma Ion Assist Co., Ltd., Kyoto (JP)

(72) Inventors: Yasuo Suzuki, Otsu (JP); Masanori Watanabe, Katano (JP)

(73) Assignee: Plasma Ion Assist Co., Ltd., Kyoto (JP)

( * ) Notice: Subject to any disclaimer, the term of this patent is extended or adjusted under 35 U.S.C. 154(b) by 0 days.

(21) Appl. No.: 16/579,874

(22) Filed: Sep. 24, 2019

(65) Prior Publication Data

US 2020/0098548 A1    Mar. 26, 2020

(30) Foreign Application Priority Data

Sep. 25, 2018  (JP) .............................. JP2018-179418

(51) Int. Cl.
*C23C 16/00*  (2006.01)
*H01L 21/306*  (2006.01)
*H01J 37/32*  (2006.01)

(52) U.S. Cl.
CPC ...... *H01J 37/32477* (2013.01); *H01J 37/321* (2013.01); *H01J 37/3211* (2013.01);
(Continued)

(58) Field of Classification Search
CPC .................. H01J 37/321; H01J 37/3211; H01J 37/32119; H01J 37/32128;
(Continued)

(56) References Cited

U.S. PATENT DOCUMENTS 8,394,232 B1 *  3/2013  Ando .................... C23C 16/507
                                                156/345.48
2002/0038791 A1    4/2002  Okumura et al.
(Continued)

FOREIGN PATENT DOCUMENTS

CN    102349356    2/2012
CN    102812153    12/2012
(Continued)

OTHER PUBLICATIONS

"Office Action of Japan Counterpart Application," dated Dec. 3, 2019, p. 1-p. 6.
(Continued)

*Primary Examiner* — Luz L Alejandro Mulero
(74) *Attorney, Agent, or Firm* — JCIPRNET

(57) ABSTRACT

A plasma treatment apparatus is provided to suppress plasma from being generated between an antenna conductor and a lid to prevent contamination inside a vacuum chamber and to put an elongated antenna unit to practical use. The plasma treatment apparatus includes a vacuum chamber that accommodates a treatment target; an inductively coupling antenna unit that generates plasma in the vacuum chamber; and a high frequency power source that supplies a high frequency power to the inductively coupling antenna unit. The inductively coupling antenna unit has one or a plurality of antenna conductors and a lid that covers an opening formed in a wall surface of the vacuum chamber, and the one or plurality of antenna conductors are attached to the lid without a gap where discharge may occur.

6 Claims, 5 Drawing Sheets

(52) U.S. Cl.
CPC . *H01J 37/32467* (2013.01); *H01J 2237/0203* (2013.01); *H01J 2237/327* (2013.01)

(58) Field of Classification Search
CPC ........... H01J 37/32137; H01J 37/32146; H01J 37/32155; H01J 37/32165; H01J 37/32174; H01J 37/32183; H01J 37/32467; H01J 37/32477; H01J 37/32532; H01J 37/32541; H01J 37/3255; H01J 37/32559; H01J 37/32568; H01J 37/32577; H05H 2001/4652; H05H 2001/466; H05H 2001/4667; H05H 2001/2412; H05H 2001/2418; H05H 2001/2425

See application file for complete search history.

(56) References Cited

U.S. PATENT DOCUMENTS

| | | | |
|---|---|---|---|
| 2012/0031562 A1* | 2/2012 | Setsuhara | H01J 37/3211 156/345.48 |
| 2013/0043128 A1* | 2/2013 | Ebe | H01J 37/3488 204/298.06 |
| 2013/0220548 A1 | 8/2013 | Setsuhara et al. | |
| 2014/0150975 A1* | 6/2014 | Ebe | H05H 1/46 156/345.48 |

FOREIGN PATENT DOCUMENTS

| | | |
|---|---|---|
| CN | 102833937 | 12/2012 |
| CN | 107523800 | 12/2017 |
| EP | 2538432 | 12/2012 |
| JP | 2005019412 | 1/2005 |
| JP | 2010212104 | 9/2010 |
| JP | 2012049065 | 3/2012 |
| JP | 2013020871 | 1/2013 |
| JP | 2017224789 | 12/2017 |
| JP | 2018-101463 * | 6/2018 |
| JP | 2018101463 | 6/2018 |
| KR | 20090131636 | 12/2009 |
| KR | 20130056900 | 5/2013 |
| KR | 20130056901 | 5/2013 |
| WO | 2012032596 | 3/2012 |
| WO | 2012033191 | 3/2012 |
| WO | 2013099366 | 7/2013 |

OTHER PUBLICATIONS

"Office Action of Japan Counterpart Application", dated Feb. 27, 2020, with English translation thereof, pp. 1-10.
"Notice of Allowance of Japan Counterpart Application," dated Apr. 16, 2020, with English translation thereof, p. 1-p. 5.
"Search Report of Europe Counterpart Application", dated Mar. 4, 2020, pp. 1-10.
Office Action of Korea Counterpart Application, with English translation thereof, dated Aug. 3, 2020, pp. 1-14.
"Office Action of China Counterpart Application", dated Jul. 15, 2021, p. 1-p. 11.

* cited by examiner

PLASMA TREATMENT APPARATUS AND DRIVING METHOD THEREOF

CROSS REFERENCE TO RELATED APPLICATIONS

This application claims the priority benefit of Japanese Patent Application No. 2018-179418, filed on Sep. 25, 2018. The entirety of the above-mentioned patent application is hereby incorporated by reference herein and made a part of this specification.

BACKGROUND

Technical Field

The disclosure relates to a plasma treatment apparatus.

Related Art

As a conventional plasma treatment apparatus, there is a plasma treatment apparatus that applies a high frequency current to an inductively coupling antenna unit disposed in a vacuum chamber, thereby, generating plasma in the vacuum chamber and performing various types of surface treatments on a treatment target such as a substrate, as disclosed in Patent Literature 1 (Japanese Laid-Open No. 2018-101463).

Specifically, in the plasma treatment apparatus, a lid covers an opening formed in a wall surface of the vacuum chamber, and a plurality of antenna conductors which configure the antenna unit is attached to an inner surface of the lid so as to be held in the vacuum chamber.

However, in the configuration described above, since a gap is formed between the lid and the antenna conductors, there is a concern that discharge occurs in the gap and plasma is generated, causing contamination inside the vacuum chamber.

Hence, in the disclosure, plasma is prevented from being generated between the antenna conductor and the lid, contamination inside the vacuum chamber is prevented, and an elongated antenna unit may be put to practical use.

SUMMARY

According to one embodiment of the disclosure, a plasma treatment apparatus is provide to include a vacuum chamber that accommodates a treatment target; an inductively coupling antenna unit that generates plasma in the vacuum chamber; and a high frequency power source that supplies a high frequency power to the inductively coupling antenna unit. The inductively coupling antenna unit has one or a plurality of antenna conductors and a lid that covers an opening formed in a wall surface of the vacuum chamber. The one or plurality of antenna conductors is attached to the lid without a gap in which discharge occurs.

DESCRIPTION OF THE EMBODIMENTS

Hereinafter, an embodiment of a plasma treatment apparatus according to the disclosure is described with reference to the drawings.

A plasma treatment apparatus 100 of the embodiment is an apparatus that operates by a so-called inductively coupled plasma (ICP) method and generates discharge plasma using an electromagnetic field generated by causing a high frequency current to flow to an inductively coupling antenna unit 20 (hereinafter, simply referred to as antenna unit 20).

Figure 1:
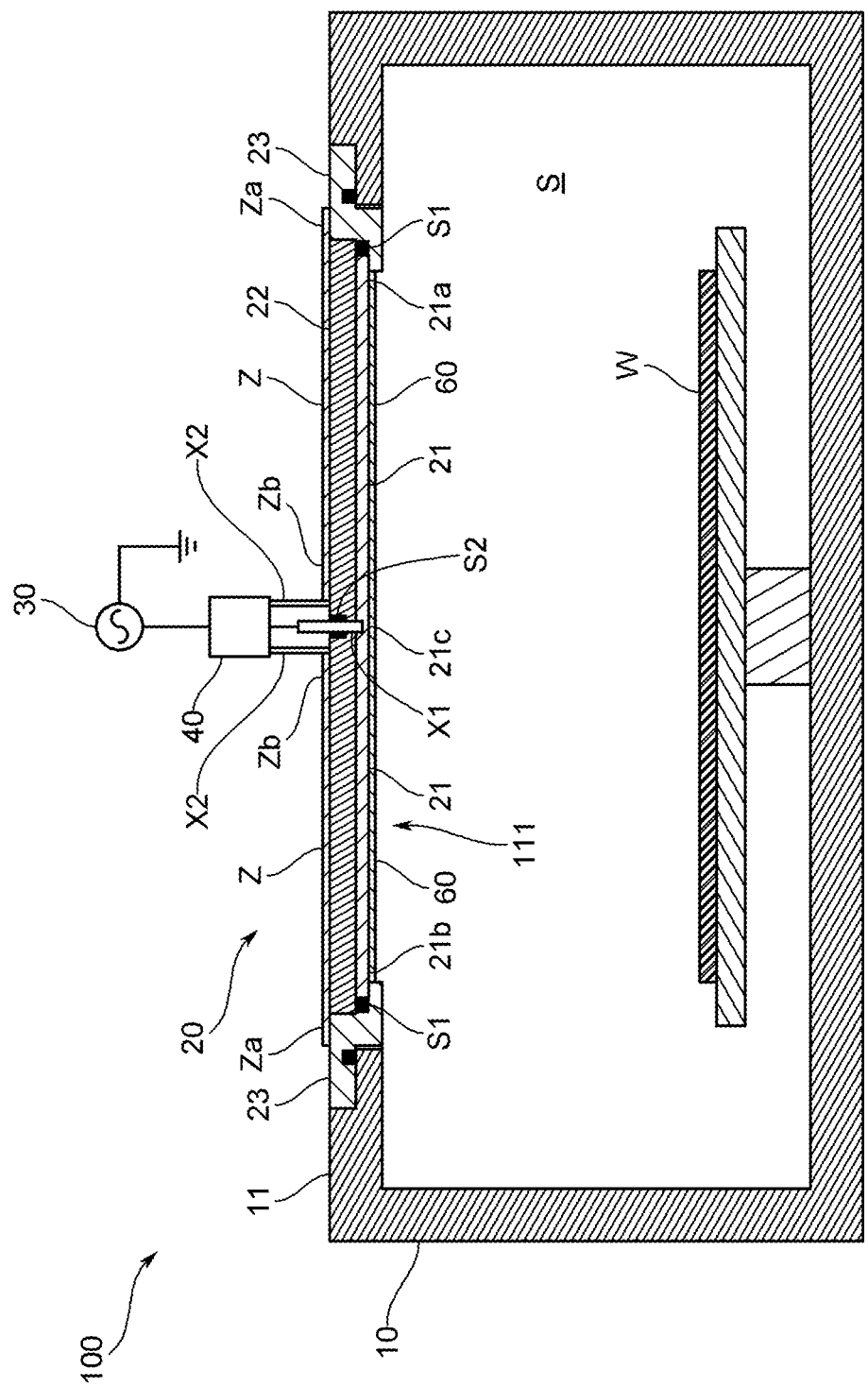
FIG. 1 is a schematic view illustrating a configuration of a plasma treatment apparatus according to an embodiment.

Specifically, as illustrated in FIG. 1, the plasma treatment apparatus 100 includes a vacuum chamber 10 that accommodates a treatment target W, the antenna unit 20 that generates plasma in an internal space S of the vacuum chamber 10, a high frequency power source 30 that supplies high frequency power to the antenna unit 20, and the like.

The internal space S of the vacuum chamber 10 is maintained at a predetermined degree of vacuum by a vacuum exhaust unit and a gas introducing unit (not illustrated). In the vacuum chamber 10, for example, a mixed gas of argon and hydrogen is introduced at a predetermined pressure (for example, 1 Pa), and the high frequency power is supplied to the antenna unit 20 from the high frequency power source 30 via a matching box 40, thereby causing discharge plasma to be excited.

Figure 2:
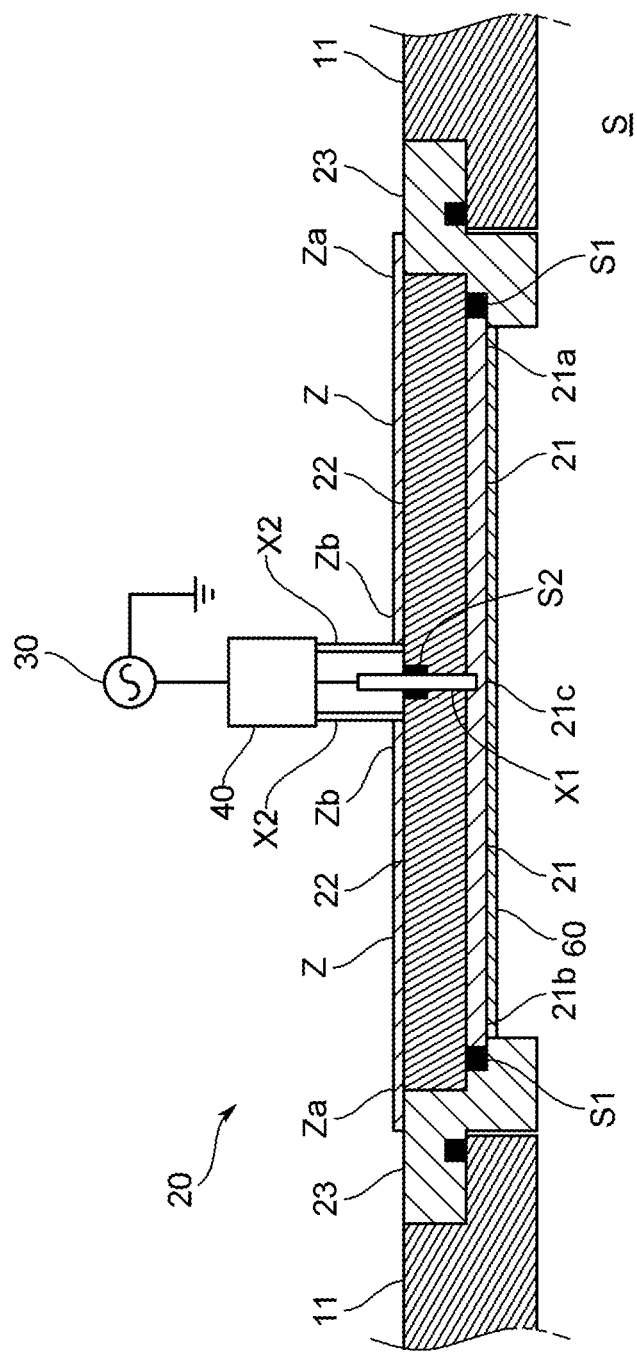
FIG. 2 is a schematic view illustrating a configuration of an antenna unit according to the embodiment.
Figure 3:
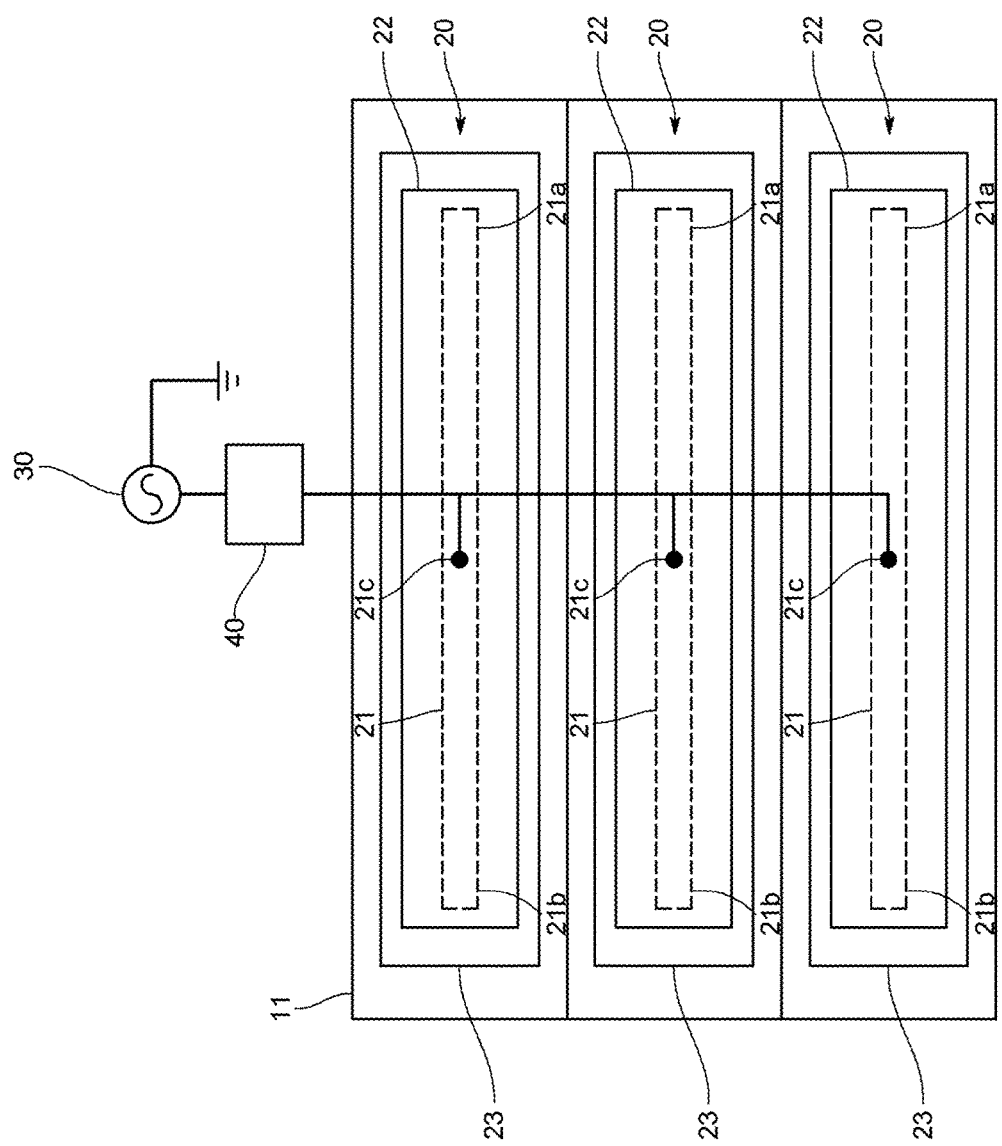
FIG. 3 is a schematic view illustrating a state of the antenna unit of the embodiment as being viewed from above.

Specifically, as illustrated in FIG. 2 and FIG. 3, the vacuum chamber 10 has an opening 111 formed in a wall surface thereof. Here, the opening 111 having, for example, a rectangular shape when viewed from above is formed in a top wall portion 11 of the vacuum chamber 10. A lid 22 is detachably arranged at the opening 111, and the opening 111 is blocked with the lid 22, thereby sealing the internal space S.

The antenna unit 20 has a configuration in which one or a plurality of antenna conductors 21 are attached to the lid 22 and, here, further includes a frame 23 that supports an outer peripheral portion of the lid 22. Besides, the antenna conductor 21, the lid 22, and the frame 23 are integrally installed at the opening 111 described above.

Moreover, the antenna unit 20 of the embodiment includes one antenna conductor 21. However, the antenna unit may include a plurality of antenna conductors 21 connected in series or in parallel. In addition, the periphery of the opening 111 of the top wall portion 11 may have the same function as that of the frame 23.

For example, the antenna conductors 21 are fed with the high frequency power of 13.56 MHz and, here, are arranged to be parallel to each other at predetermined intervals. The antenna conductor 21 has a linear shape with a length of, for example, 500 mm or longer and has a width dimension of, for example, about 10 mm to 30 mm.

The lid 22 has a length dimension longer than that of the antenna conductor 21 in a longitudinal direction of the lid and is supported by the frame 23 via a seal member S1. The lid 22 has a shape of a flat plate and is an insulating lid made of ceramics such as alumina, for example. Moreover, the lid 22 may be a lid made of an organic material such as PEEK resin or fluororesin which has heat resistance.

Besides, the antenna conductor 21 described above is attached to the lid 22 without a gap therebetween. Specifically, the antenna conductor 21 is arranged to be in contact with a lower surface of the lid 22, and both end portions 21a and 21b of the antenna conductor are connected to the frame 23 and are grounded via the frame 23.

Moreover, a contamination preventive plate 60 such as a quartz plate is arranged under the antenna conductor 21, and the contamination preventive plate prevents the antenna conductor 21 from being contaminated with by-products such as dust produced in the vacuum chamber 10. Here, since the lid 22 separates the internal space S of the vacuum chamber 10, which is maintained at a predetermined degree of vacuum, from the atmosphere outside the vacuum chamber 10, a relatively thin plate can be used as the contamination preventive plate 60.

In the embodiment, as illustrated in FIG. 3, the antenna units 20 are installed at the plurality of openings 111 formed in the top wall portion 11 of the vacuum chamber 10, and the antenna conductors 21 are attached to the respective lids 22 without a gap therebetween, the lids covering the respective openings 111. Here, the openings 111 may have a width by which the lid 22 is attachable and detachable, and thus the width dimension thereof is, for example, 40 mm or wider and 150 mm or narrower and preferably 100 mm or narrower.

As described above, the plurality of openings 111 is formed corresponding to the respective antenna units 20, and thereby a size of the openings 111 can be reduced. Hence, mechanical strength required by the lids 22 that cover the respective openings 111 is reduced. Consequently, a thickness of the lid 22 can be reduced, and the lid 22 here has a thickness of 5 mm or larger and 10 mm or smaller, for example.

As illustrated in FIG. 2, a feeding terminal X1 is connected to the antenna conductor 21. Specifically, a through-hole is formed in the lid 22, and the feeding terminal X1 is inserted and, for example, brazed into the through-hole via a seal member S2. Here, the through-hole is formed at a central portion 21c of the antenna conductor 21 in a longitudinal direction thereof, and thereby the feeding terminal X1 is electrically connected to the central portion 21c of the antenna conductor 21 in the longitudinal direction thereof. Besides, as illustrated in FIG. 3, the high frequency power is supplied from the common high frequency power source 30 to the antenna conductors 21 that configure the respective antenna units 20, and here the high frequency power is supplied to the central portion 21c of the antenna conductor 21 in the longitudinal direction thereof.

On the other hand, both end portions 21a and 21b of the antenna conductor 21 in the longitudinal direction thereof are supported by the frame 23 and are electrically connected to the frame 23. The frame 23 is a conductive member made of a stainless steel material, an aluminium material, or the like and is electrically connected to a wall surface of the vacuum chamber 10. Consequently, both end portions 21a and 21b of the antenna conductor 21 in the longitudinal direction thereof are grounded. Moreover, both end portions 21a and 21b of the antenna conductor 21 in the longitudinal direction thereof may be grounded via a capacitor.

The plasma treatment apparatus 100 of the embodiment further includes a conductive member Z arranged to be substantially parallel to the antenna conductor 21 on a surface of the lid 22, the surface being opposite to a surface of the lid 22 to which the antenna conductor 21 is attached. The conductive member Z is arranged along the longitudinal direction of the antenna conductor 21, one end portion Za is electrically connected to the frame 23, and the other end portion Zb is connected to a ground terminal X2 of the matching box 40, for example.

According to the configuration, the high frequency current supplied to the central portion 21c of the antenna conductor 21 in the longitudinal direction thereof flows to the one end portion 21a or the other end portion 21b of the antenna conductor 21, then flows into the one end portion Za of the conductive member Z through the frame 23, and flows to the other end portion Zb of the conductive member Z. Consequently, the direction of the high frequency current flowing in the antenna conductor 21 is opposite to a direction of the high frequency current flowing in the conductive member Z. In other words, the antenna conductor 21, the frame 23, and the conductive member Z configure a reciprocating circuit with respect to the high frequency current supplied to the central portion 21c of the antenna conductor 21 in the longitudinal direction thereof. In the reciprocating circuit, a mutual inductance is generated between reciprocating antenna conductors, and an effect of cancelling and decreasing impedance of the antenna conductor against the high frequency current by an amount of the mutual inductance is achieved.

According to the plasma treatment apparatus 100 having the configuration described above, since the antenna conductor 21 is attached to the lid 22 without a gap therebetween, a gap where discharge may occur or plasma caused by the discharge is generated is not formed between the antenna conductor 21 and the lid 22, and the lid 22 or the like can be prevented from being contaminated.

Further, since the lid 22 is made of ceramics, the lid 22 separates the internal space S of the vacuum chamber 10, which is maintained at the predetermined degree of vacuum, from the atmosphere outside the vacuum chamber 10, the mechanical strength of the lid 22 can be ensured.

Furthermore, since the openings 111 are formed in the top wall portion 11 of the vacuum chamber 10 corresponding to the respective antenna units 20, the size of the openings 111 can be reduced. Consequently, since the mechanical strength required by the lid 22 that covers each of the openings 111 is reduced, the thickness of the lid 22 can be reduced, and a reduction in manufacturing cost is achieved.

Additionally, the reciprocating circuit is configured using the conductive member Z, and the direction of the high frequency current flowing in the antenna conductor 21 is opposite to a direction of the high frequency current flowing in the conductive member Z. Hence, the impedance of the antenna conductor is cancelled by the amount of the mutual inductance generated by that the high frequency current flows to the antenna conductor 21 or the conductive member Z. Furthermore, since the mutual inductance of the reciprocating circuit is inversely proportional to the thickness of the lid 22, the lid 22 can be thinned to a thickness of, for example, 5 mm to 10 mm, and thus impedance with respect to the high frequency current can be further decreased. Consequently, an increase in impedance due to elongation of the antenna conductor 21 can be suppressed, and an elongated antenna unit can be put to practical use.

Moreover, the disclosure is not limited to the embodiment described above.

Figure 4:
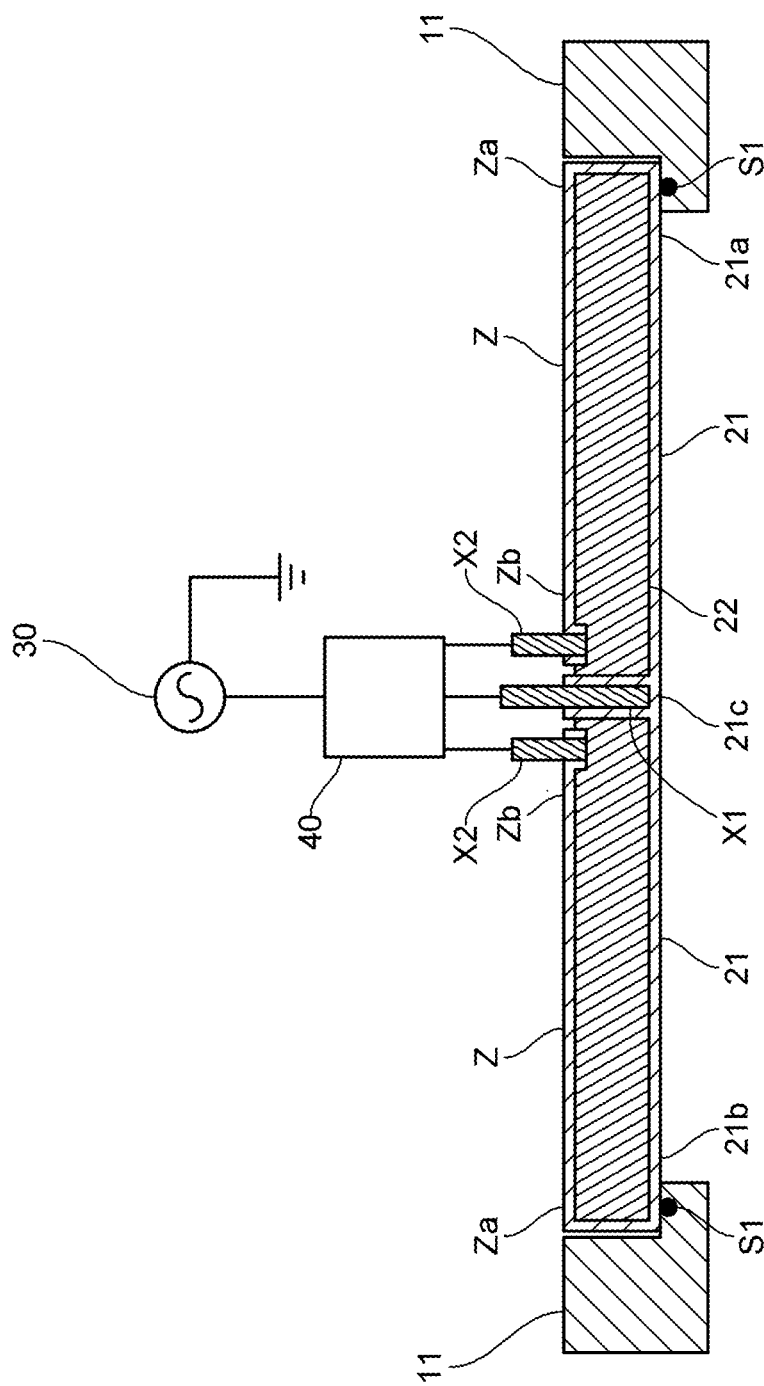
FIG. 4 is a schematic view illustrating a configuration of a plasma treatment apparatus according to another embodiment.

For example, as illustrated in FIG. 4, the antenna conductor 21 may be formed on a surface of the lid 22 by a metallization method.

Specifically, first, the lid 22 made of alumina or the like is processed to form a hole for the feeding terminal X1 and a hole for the ground terminal X2 of the matching box 40. Then, Mo—Mn paste is applied to an electrode forming portion (antenna conductor or hole for an electrode terminal)

on the surface of the lid 22 and is burned, and thereby a metal layer is formed. Then, Ni plating or the like is performed on the metal layer, and the antenna conductor 21 having a thickness of, for example, about 30 μm to 40 μm is formed by silver brazing or the like. A Kovar pin having a coefficient of thermal expansion approximate to that of the alumina lid 22 is inserted into the hole for the terminal used as the feeding terminal X1 or the ground terminal X2 and, and an electrode terminal is brazed using silver brazing or the like.

According to the configuration described above, not only that the antenna conductor 21 can be attached to the lid 22 without a gap therebetween, but heat generated in the antenna conductor can also be dissipated to the lid.

Furthermore, in such a process described above, the hole for the feeding terminal is formed at a central portion of the lid 22 in a longitudinal direction thereof, and the holes for the ground terminal are formed at both sides of the lid 22. In this manner, a reciprocating circuit with respect to the high frequency power can be formed by metal films formed on an upper surface and a lower surface of the lid 22.

Figure 5:
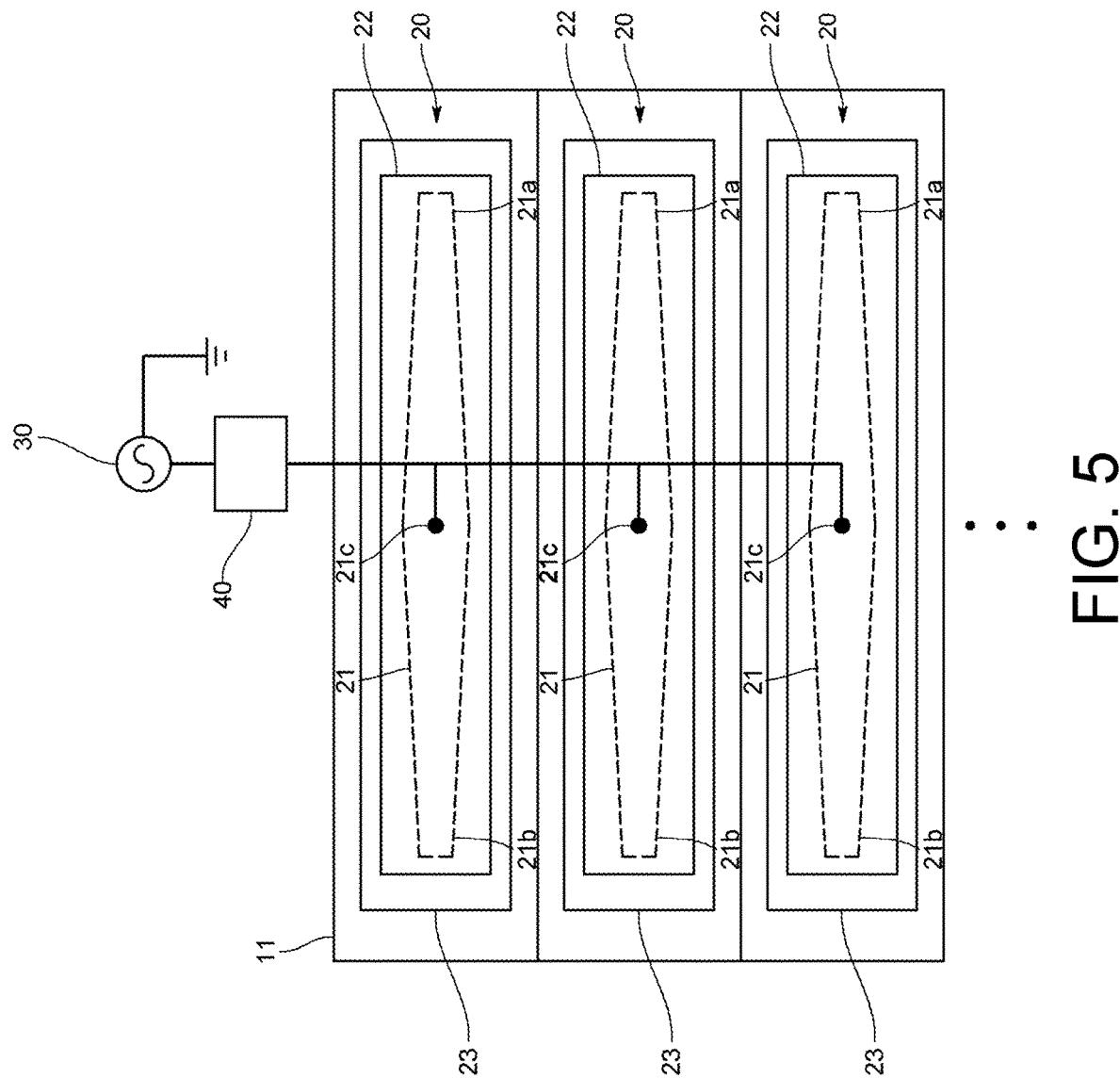
FIG. 5 is a schematic view illustrating a configuration of an antenna unit according to another embodiment.

In addition, the shape of the antenna conductor 21 is not limited to the linear shape as described in the above embodiment; for example, the antenna conductor 21 may have a shape in which the width dimension varies between the central portion in the longitudinal direction of the antenna conductor and both end portions in the longitudinal direction thereof, specifically, as illustrated in FIG. 5, the antenna conductor may have a shape in which the width dimension is gradually reduced from the central portion 21*c* toward the one end portion 21*a* and the other end portion 21*b* in the longitudinal direction.

Inductance of a parallel plate-type reciprocating antenna conductors is proportional to a length and an interval of the reciprocating antenna conductors and is inversely proportional to a width thereof. In other words, when the reciprocating antenna conductors approach each other, the inductance decreases, and when the reciprocating antenna conductors are separated from each other, the inductance increases. By increasing the width of the central portion of the antenna conductor and decreasing the width of both end portions of the antenna conductor, the inductance at the central portion can be decreased, and the inductance at both end portions can be increased. Hence, by increasing power consumption at both end portions, a reduction in plasma density at both end portions is compensated and uniform plasma density at the antenna conductor in the longitudinal direction thereof can be obtained.

In the embodiment described above, a high frequency power of 13.56 MHz is used as the high frequency power; however, the high frequency is not limited thereto, and a frequency of 30 kHz to 30 MHz can be applied as the high frequency power.

An installation location of the antenna unit 20 is not limited to the top wall portion 11 of the vacuum chamber 10, and the antenna unit may be installed, for example, on a side wall or a bottom wall of the vacuum chamber 10 according to the form of the plasma treatment apparatus 100. Moreover, when the antenna unit 20 is installed on the side wall of the vacuum chamber 10, the plasma treatment can be performed while the treatment target W is transported along an up-down direction (vertical direction).

Other Configurations

According to one embodiment of the disclosure, a plasma treatment apparatus is provided to include a vacuum chamber that accommodates a treatment target; an inductively coupling antenna unit that generates plasma in the vacuum chamber; and a high frequency power source that supplies a high frequency power to the inductively coupling antenna unit. The inductively coupling antenna unit has one or a plurality of antenna conductors and a lid that covers an opening formed in a wall surface of the vacuum chamber. The one or plurality of antenna conductors is attached to the lid without a gap in which discharge occurs.

According to the plasma treatment apparatus having the configuration described above, since the one or plurality of antenna conductors is attached to the lid without a gap therebetween, plasma is not generated between the antenna conductor and the lid, and contamination inside the vacuum chamber can be prevented.

In addition, a plurality of openings is formed to be substantially parallel to each other in the wall surface of the vacuum chamber, and the inductively coupling antenna unit is installed in each of the openings.

In this configuration, since a plurality of inductively coupling antenna units are attached to the individual openings, respectively, a size of the opening can be reduced compared with a case where the plurality of inductively coupling antenna units is attached to one opening. Consequently, since the mechanical strength required by the lid that covers each of the openings is reduced, a thickness of the lid can be reduced, and a reduction in manufacturing cost is achieved.

As described above, the size (width dimension) of each of the openings is reduced, and thereby the plurality of inductively coupling antenna units can be closely disposed. Consequently, a difference in length can be suppressed from occurring in a current path such as a power distribution line that connects the common high frequency power source and the respective antenna conductors.

Hence, the high frequency power may be supplied to the plurality of inductively coupling antenna units from the common high frequency power source via a matching box.

In this configuration, the plurality of inductively coupling antenna units is closely disposed, and thereby a difference in length can be suppressed from occurring in the current path such as the distribution line that connects the common high frequency power source and the respective inductively coupling antenna units, and a difference in current flowing to the plurality of antenna conductors can be suppressed. Further, a reduction in manufacturing cost with the common high frequency power source can be achieved.

In order for the lid to have mechanical strength necessary for separating vacuum in the vacuum chamber from an outside (atmosphere) of the vacuum chamber even though the thickness of the lid is reduced, the lid may be made of ceramics or an organic material.

In addition, a feeding terminal of the high frequency power is connected to a central portion of the antenna conductor in a longitudinal direction thereof, and both end portions of the antenna conductor in the longitudinal direction thereof are grounded, and the high frequency power is supplied to the central portion of the antenna conductor in the longitudinal direction thereof via the feeding terminal.

In this configuration, since a current flowing in the antenna conductor flows from the central portion in the longitudinal direction toward both of the end portions in the longitudinal direction, impedance can be substantially decreased by a half compared with a configuration in which the high frequency power is supplied to one end portion of the antenna conductor in the longitudinal direction so as to be introduced to the other end portion in the longitudinal direction, and elongation of the antenna conductor is achieved.

In addition, the inductively coupling antenna unit further includes a frame that supports an outer peripheral portion of the lid, and a conductive member arranged to be substantially parallel to the antenna conductor on a surface of the lid, the surface being opposite to a surface of the lid to which the antenna conductor is attached. End portions of the antenna conductor in the longitudinal direction thereof are electrically connected to the frame, one end portion of the conductive member is electrically connected to the frame, and the other end portion of the conductive member is connected to a ground terminal of a matching box. The antenna conductor, the frame, and the conductive member configure a reciprocating circuit with respect to the high frequency power supplied to the central portion of the antenna conductor in the longitudinal direction thereof.

In this configuration, a further decrease in impedance with respect to the high frequency power is achieved by the reciprocating circuit.

In addition, a width of the antenna conductor or/and the conductive member is different at a central portion in a longitudinal direction thereof and at both end portions in the longitudinal direction thereof.

In this configuration, inductance of the antenna conductor changes along the longitudinal direction of the antenna conductor, and thereby density of the plasma generated in the longitudinal direction of the antenna conductor can be equalized.

Mover, the antenna conductor or/and the conductive member is/are formed on a surface of the lid by a metallization process.

In this configuration, the antenna conductor or/and the conductive member is/are simply formed, and attachment/detachment or maintenance is easily performed.

According to the disclosure having the configuration described above, plasma is prevented from being generated between the antenna conductor and the lid, and contamination inside the vacuum chamber can be prevented. In addition, a reciprocating circuit is formed by the antenna conductor and the conductive member, and thereby inductance can be reduced and an elongated antenna unit can be put to practical use.

Besides, the disclosure is not limited to the above-described embodiment, and it is needless to say that various modifications can be made in a scope not departing from the gist of the disclosure.

What is claimed is:

1. A plasma treatment apparatus, comprising:
a vacuum chamber that accommodates a treatment target;
a plurality of inductively coupling antenna units that generate plasma in the vacuum chamber; and
a high frequency power source that supplies a high frequency power to the inductively coupling antenna units;
wherein each of the plurality of inductively coupling antenna units has one or a plurality of antenna conductors and a lid that covers an opening formed in a wall surface of the vacuum chamber, and
the one or the plurality of antenna conductors is attached to the lid without a gap in which discharge occurs,
wherein a feeding terminal of the high frequency power is connected to a central portion of the one or the plurality of antenna conductors in a longitudinal direction thereof, and two end portions of the one or the plurality of antenna conductors in the longitudinal direction thereof are grounded,
the high frequency power is supplied to the central portion of the one or the plurality of antenna conductors in the longitudinal direction thereof via the feeding terminal,
wherein each of the plurality of inductively coupling antenna units further comprises:
a frame that supports an outer peripheral portion of the lid, and
a conductive member arranged to be substantially parallel to the one or the plurality of antenna conductors on a first surface of the lid, the first surface being opposite to a second surface of the lid to which the one or the plurality of antenna conductors is attached,
wherein the two end portions of the one or the plurality of antenna conductors in the longitudinal direction thereof are electrically connected to the frame, one end portion of the conductive member is electrically connected to the frame, and the other end portion of the conductive member is connected to a ground terminal of a matching box, and
wherein the one or the plurality of antenna conductors, the frame, and the conductive member configure a reciprocating circuit with respect to the high frequency power supplied to the central portion of the one or the plurality of antenna conductors in the longitudinal direction thereof.

2. The plasma treatment apparatus according to claim 1, wherein a plurality of openings are formed to be substantially parallel to each other in the wall surface of the vacuum chamber, and each of the plurality of the openings is installed with one of the plurality of the inductively coupling antenna units.

3. The plasma treatment apparatus according to claim 2, wherein the high frequency power is supplied to the plurality of inductively coupling antenna units from a common high frequency power source via the matching box.

4. The plasma treatment apparatus according to claim 1, wherein the lid is made of ceramics or an organic material.

5. The plasma treatment apparatus according to claim 1, wherein a width of the one or the plurality of antenna conductors or/and the conductive member is different at the central portion in a longitudinal direction thereof and at both end portions in the longitudinal direction thereof.

6. The plasma treatment apparatus according to claim 1, wherein the one or the plurality of antenna conductors or/and the conductive member is/are formed on a surface of the lid by a metallization method.

* * * * *